United States Patent [19]
Seddon et al.

[11] Patent Number: 5,814,545
[45] Date of Patent: Sep. 29, 1998

[54] SEMICONDUCTOR DEVICE HAVING A PHOSPHORUS DOPED PECVD FILM AND A METHOD OF MANUFACTURE

[75] Inventors: Kenneth M. Seddon; Gregory W. Grynkewich, both of Gilbert; Vida Ilderem, Phoenix; Heidi L. Denton, Scottsdale; Jeffrey Pearse, Chandler, all of Ariz.

[73] Assignee: Motorola, Inc., Schaumburg, Ill.

[21] Appl. No.: 810,037

[22] Filed: Mar. 4, 1997

Related U.S. Application Data

[63] Continuation of Ser. No. 537,378, Oct. 2, 1995, abandoned.
[51] Int. Cl.$^6$ ........................ H01L 21/225; H01L 21/336
[52] U.S. Cl. ........................... 438/303; 438/305; 438/563
[58] Field of Search ..................................... 438/230, 231, 438/301, 303, 305, 563

[56] References Cited

U.S. PATENT DOCUMENTS

| | | | |
|---|---|---|---|
| 4,621,413 | 11/1986 | Lowe et al. | |
| 4,755,478 | 7/1988 | Abernathey et al. | 437/41 |
| 4,807,016 | 2/1989 | Douglas | 156/643 |
| 4,837,179 | 6/1989 | Foster et al. | 437/44 |
| 4,892,753 | 1/1990 | Wang et al. | 427/38 |
| 4,948,744 | 8/1990 | Kita | 438/305 |
| 5,166,101 | 11/1992 | Lee et al. | 437/238 |
| 5,314,845 | 5/1994 | Lee et al. | 437/238 |
| 5,354,387 | 10/1994 | Lee et al. | 748/33.3 |
| 5,393,704 | 2/1995 | Huang et al. | 437/203 |

FOREIGN PATENT DOCUMENTS

| | | | |
|---|---|---|---|
| 0594298 | 4/1994 | European Pat. Off. | |
| WO8707763 | 12/1987 | WIPO | 437/41 SM |

OTHER PUBLICATIONS

Wolf, S., Silicon Processing, vol. 1, Lattice Press, 1986, pp. 182–187.
Pillote, C., et al., "Characterization of Phosphosilicate . . . ", Thin Solid Films, vol. 236, 1993, pp. 287–293.
Wolf, S., Silicon Processing, vol. 1, Lattice Press, 1986, pp. 187–191, 397–399.
Wolf, S., Silicon Processing, vol. 2, Lattice Press, 1990, pp. 222–228, 238–239.

*Primary Examiner*—T. N. Quach
*Attorney, Agent, or Firm*—Kenneth M. Seddon; Daniel R. Collopy

[57] ABSTRACT

Portions of a semiconductor device (10,30) are formed from a dielectric layer (16,38,46) which is deposited using a plasma enhanced chemical vapor deposition (PECVD) process which adds trimethylphosphite as a dopant source during the deposition. A first embodiment forms sidewall spacers (17) adjacent to a gate structure (14) and forms doped regions (19) under the sidewall spacers (17) by annealing the dielectric layer (16) and driving phosphorus into a substrate (11). A second embodiment uses the trimethylphosphite doped film as an interlevel dielectric layer (38) which can be planarized to provide a flat surface for the formation of metal interconnect lines. A third embodiment of the present invention uses the trimethylphosphite doped film as a passivation layer (46) which is deposited in a single step process and has a phosphorus concentration to getter mobile ions.

10 Claims, 3 Drawing Sheets

SEMICONDUCTOR DEVICE HAVING A PHOSPHORUS DOPED PECVD FILM AND A METHOD OF MANUFACTURE

This application is a continuation of prior application Ser. No. 08/537,378, filed Oct. 2, 1995, now abandoned.

BACKGROUND OF THE INVENTION

The present invention relates, in general, to semiconductor devices, and more particularly, to dielectric layers used to form portions of semiconductor device structures.

The evolution of semiconductor device structures has required the use of dielectric structures which are used to either electrically isolate various regions of the semiconductor device, or to provide the semiconductor device with environmental protection. Dielectric structures include sidewall spacers which are could be used to isolate a silicided gate structure from silicided source and drain regions, interlevel dielectric layers (ILD) which electrically isolate various levels of conductive interconnect or active areas, and passivation layers which shield the semiconductor device from contamination and moisture after it has completed the fabrication process.

Dielectric structures can be formed by depositing and patterning a dielectric layer such as silicon dioxide or silicon nitride. One method for forming silicon dioxide layers is with the thermal decomposition of silane based reactants in a low pressure chemical vapor deposition (LPCVD) chamber typically at a temperature of 400° C. to 500° C. The nature of an LPCVD reaction is that a layer of silicon dioxide will be formed on all surfaces including the deposition chamber. As a result, it is well known that a silane based reaction using the LPCVD process creates a high density of large particulates on product wafers and that the reaction chamber requires many hours of scheduled and unscheduled maintenance to keep the particulate counts in the reaction chamber at an acceptable level. The CVD process is also a batch process meaning it takes just as long to process 10 wafers as it does to process 100 wafers which will impact the throughput of a manufacturing line. The LPCVD decomposition of silane also has the limitation in that it is not a scaleable process for wafers above 5 inches in diameter.

One previously known method for forming an inter-level dielectric layer to protect a semiconductor device uses a three layer dielectric stack. First a layer of silicon dioxide is deposited using a plasma enhanced chemical vapor deposition system (PECVD) that decomposes tetraethylorthosilicate (TEOS). Then a mobile ion barrier is formed on the dielectric layer using a spin-on glass process. Spin-on glass (SOG) processes deposit a silicon dioxide layer by spinning dissolved silicates or siloxanes across a wafer similar to the process used to form photoresist layers. The SOG layer is then baked at 150° C. to drive off moisture and solvent and then cured at 450° C. to 900° C. A third dielectric layer using a PECVD reaction of TEOS caps off the passivation layer. SOG layers, however, can crack during the curing process and are known to generate significant particle counts which can affect the reliability and yield of the semiconductor device manufactured. This method is also a three step deposition process which increases the total processing time and consequently the manufacturing expense.

In some applications, it is also necessary to dope the dielectric layer or layers with a phosphorus source for either mobile ion gettering or to reduce the temperature at which the dielectric layer will flow. One commonly used source of phosphorus dopant is phosphine which unfortunately is an extremely environmentally hazardous and toxic gas which requires great care in its handling. Silane based LPCVD reactions are also known to generate yield limiting defects and require a rigorous monitoring and maintenance schedule to keep particle counts at an acceptable level. With LPCVD reactions that use phosphine as a dopant source, it is difficult to accurately control the batch to batch phosphorus concentration level in the film. This variation can affect the conformality and any subsequent wet or dry etch processes of the doped dielectric layer. The etch rate of dielectric layers is in direct correlation with the phosphorus content in the film.

Other methods for depositing dielectric layers use a plasma enhanced chemical vapor deposition (PECVD) system which allows the deposition to be performed at a lower temperature than traditional CVD films. To form multiple layers of metal, silicon, or polysilicon interconnect lines, it is often necessary to form thick layers of isolation material between each of the interconnect levels and planarize the surface of the semiconductor device. These requirements, however, necessitate a conformal film that is generally free of voids. In order to form such a film, previously known techniques form the dielectric layer in two or more process steps. In one such case the first deposition is a traditional LPCVD deposition which provides the bulk of the film's thickness. A second deposition step is performed which is a PECVD process that forms a cap layer with a high concentration of dopant. This two step deposition process reduces the throughput and increases the manufacturing cost of semiconductor devices.

Accordingly, it would be advantageous to have a method for forming a dielectric layer which could be used to form isolation structures for a semiconductor device that did not produce the particulate levels associated with LPCVD deposition techniques. It would be of further advantage if the method improved the throughput of the wafer fabrication line and was scaleable to wafers larger than 5 inches in diameter. It would be of even further advantage if the method could provide a doped film with a dopant concentration that is repeatable from one deposition run to the next deposition run and did not require the use of hazardous or toxic gases.

SUMMARY OF THE INVENTION

The present invention provides, among other things, a method for forming a semiconductor device that includes the step of forming a layer of silicon dioxide that is doped with trimethylphosphite. For example, a layer of silicon dioxide doped with trimethylphosphite can be used to form sidewall spacers along the sides of a gate structure. This can be accomplished by depositing a blanket layer of silicon dioxide over the gate structure and then using an anisotropic etch to remove the blanket layer save for the spacers that remain along the sides of the gate structure. An anneal step can then be used to drive the dopant in the sidewall spacers into the underlying substrate to adjust the electrical performance of the semiconductor device.

The advantages of the present invention includes a reduction in defect particulates and an improvement in conformality compared to some Low Pressure Chemical Vapor Deposition (LPCVD) techniques. The process also uses trimethylphosphite rather than phosphine which is an environmentally safer and less toxic dopant source.

DETAILED DESCRIPTION OF THE DRAWINGS

Figure 1:
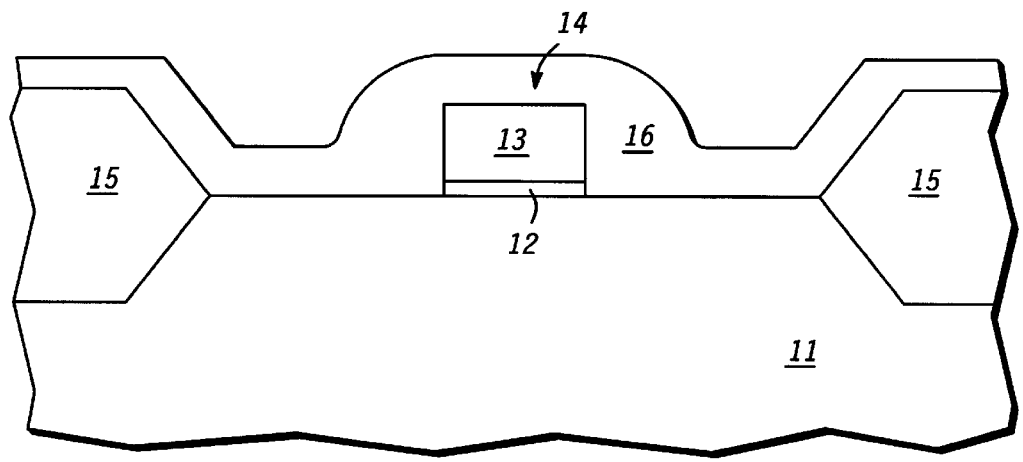
FIGS. 1–2 are enlarged cross-sectional views of a semiconductor device according to a first embodiment at various stages of fabrication.

FIG. 1 is an enlarged cross-sectional view of a semiconductor device 10 according to a first embodiment of the present invention. Semiconductor device 10 is preferably formed on a silicon substrate 11. In the present invention, semiconductor device 10 is an n-channel device, although it will be understood that the present invention can be used to form p-channel devices by changing n-type conductivities to p-type and vice versa.

To fabricate semiconductor device 10 as shown in FIG. 1, portions of substrate 11 are oxidized to grow field oxide regions 15. Using an oxidizing mask such as silicon nitride, portions of substrate 11 are exposed to an oxygen rich ambient at about 800° C. to 1200° C. Field oxide regions 15 are approximately 5,000 angstroms thick and provide electrical isolation for semiconductor device 10. The unoxidized portion of substrate 11 between field oxide regions 15 is referred to as active area which is where semiconductor device 10 is formed.

A gate structure 14, is then patterned on substrate 11 which can comprise a silicon dioxide layer 12 with a thickness in the range from 50 angstroms to 1000 angstroms and a layer of polysilicon 13 which is 1,000 angstroms to 4,000 angstroms thick is deposited on silicon dioxide layer 12. A dielectric layer or a phosphorus doped PECVD film 16, with a thickness of 1,000 angstroms to 5,000 angstroms, is then deposited over substrate 11 and gate structure 14 using a plasma enhanced chemical vapor deposition (PECVD) process using tetraethylorthosilicate (TEOS). During deposition, trimethylphosphite is added to produce a phosphorus concentration in dielectric layer 16. A detailed description of how to form dielectric layer 16 will now be provided.

Substrate 11 is placed in a PECVD reaction chamber under vacuum with a pressure of approximately 0.5 Torr to 75 Torr and a temperature of approximately 370° C. to 410° C. TEOS and trimethylphosphite, which come from liquid sources, are introduced into the reaction chamber through a shower head and exposed to an RF generated plasma with a power level of 100 watts to 500 watts which creates the reactions required to form dielectric layer 16. The formation of dielectric layer 16 is performed with a single deposition step through two reactions occurring simultaneously in the chamber, TEOS is decomposed to form silicon dioxide on substrate 11 and trimethylphosphite is simultaneously decomposed by the plasma to release phosphorus in such a form that it is incorporated into dielectric layer 16. The quantity of trimethylphosphite in the reaction chamber can be varied from 0.5 SCCM to 10 SCCM to provide a phosphorus concentration of 1 percent to 12 percent by weight.

Previously known methods of forming a doped silicon dioxide layer have used low pressure chemical vapor deposition (LPCVD) which relies on the diffusion of reactant gases at temperatures around 450° C. With LPCVD or CVD reactions, phosphine gas is typically used to dope the silicon dioxide layer as it is deposited. In the present invention, however, trimethylphosphite, which is a stable liquid that is not as toxic as phosphine gas, is used to dope dielectric layer 16. Since trimethylphosphite is much easier and safer to use than phosphine, it does not have the environmental issues associated with the use of phosphine gas.

Trimethylphosphite also offers an unexpected improvement in the conformality of dielectric layer 16 as it is deposited. Conformality describes how accurately a process can deposit evenly over the top and sides of the structures, and is a function of the processing conditions and dopant concentration. To quantify conformality, the thickness of the film along vertical surfaces is divided by the thickness of the film along horizontal surfaces. Traditional LPCVD deposition techniques, which use phosphine dopant, have a significant variation in phosphorus concentration from one deposition to the next. This will affect both the accuracy of wet or dry etch steps that follow and will vary the conformality of the film deposited. Typically, phosphine doped LPCVD reactions can only provide step coverage ratios of 30 percent. With the present invention, trimethylphosphite provides accurate control of the dopant concentration across the wafer and from wafer to wafer. It also allows for step coverage ratios in excess of 60 percent. As device geometries decrease, dielectric layers that can be deposited with high conformality ratios will become a necessity.

Traditional LPCVD deposition techniques deposit silicon dioxide on all surfaces inside the reaction chamber. As a result, there is a build up of dielectric material on the processing equipment as additional batches are completed. This build up results in large particulates that deposit on the product wafers and requires an extensive maintenance effort to try to reduce the particulate level. In the present invention, the deposition of dielectric layer 16 on substrate 11 is accurately controlled by the plasma used to promote the reaction. As a result, the particulate levels are often five times lower than with previously known silane based LPCVD deposition techniques.

An additional benefit of the present invention is that the doped PECVD deposition is performed in a single wafer reaction chamber with a deposition rate of approximately 8,000 angstroms per minute. This offers a much more efficient process which will improve the throughput of a fabrication facility, especially for small lot sizes. CVD reactions, on the other hand, take place as a batch reaction with typically 100 to 200 wafers being processed simultaneously and offer a deposition rate on the order of 200 angstroms per minute.

Figure 2:
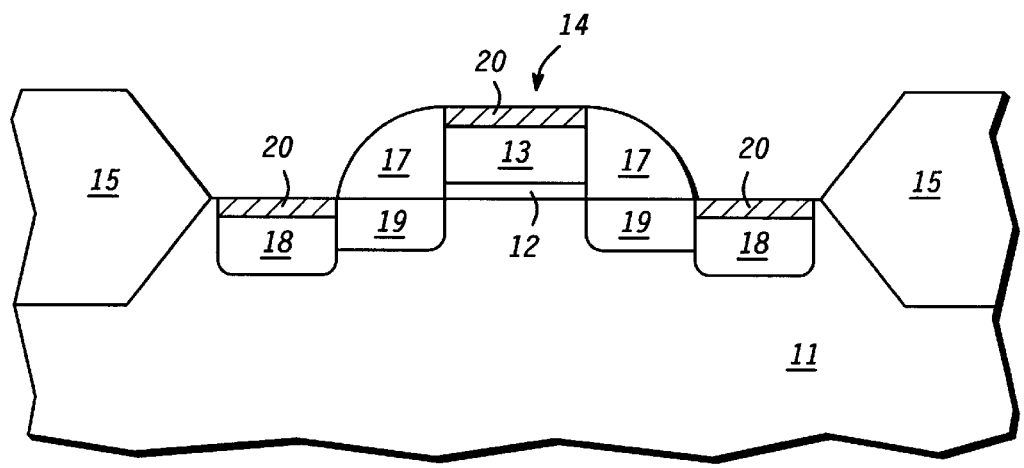

FIG. 2 is an enlarged cross-sectional view of semiconductor device 10 after further processing. Dielectric layer 16 is etched using a reactive ion etch (RIE) process to form sidewall spacers 17. The width of sidewall spacers 17 at the surface of substrate 11 is determined by the conformality of dielectric layer 16 and the amount of etch and overetch performed during the RIE process.

An anneal step is then performed to activate the dopant in sidewall spacers 17 to form doped regions 19 under sidewall spacers 17. Substrate 11 is heated to about 950° C. to 1100° C. for about 15 minutes to 60 minutes which will drive the phosphorus concentration from sidewall spacers 17 into substrate 11. The depth and concentration of doped regions 19 can be controlled by the amount of trimethylphosphite used to form sidewall spacers 17 and the time and temperature of the anneal step. Previously, lightly doped drain regions under sidewall spacers had to be formed with an additional photoresist pattern and implant step. The present invention provides for the obviation of these steps by forming doped regions 19 with the out diffusion of phosphorus from sidewall spacers 17. This reduction of three process steps will reduce the manufacturing cost of semiconductor device 10. It is also possible to omit the above mentioned anneal step if doped regions 19 are not desired. Sidewall spacers 17 can then be used to provide mobile ion protection for gate structure 14.

Sidewall spacers 17 are then used in conjunction with a patterned photoresist layer (not shown) to define source and drain regions 18 in substrate 11. Source and drain regions 18 are formed by ion implanting with an n-type dopant such as arsenic into substrate 11. An arsenic dose of about $5.0 \times 10^{14}$ atoms/cm$^2$ to $1.0 \times 10^{15}$ atoms/cm$^2$ and an implant energy of about 30 keV to 100 keV is suitable to provide source and drain regions 18.

Sidewall spacers 17 are also used to prevent electrical shorts during the formation of silicide regions 20 on source and drain regions 18 and gate structure 14. A layer of refractory material, such as titanium, is deposited on semiconductor substrate 11 and gate structure 14. A rapid thermal anneal (RTA) step at 600° C. to 700° C. for 30 seconds to 2 minutes is performed to react the titanium with the silicon of source and drain regions 18 and gate structure 14. Any remaining portions of the refractory material are then removed with a wet etch such as ammonium hydroxide and hydrogen peroxide. A second RTA step at 750° C. to 950° C. for 10 seconds to 2 minutes is performed to lower the resistivity of silicide regions 20. Because sidewall spacers 17 are formed from silicon dioxide, they will not react with the refractory material and thus electrically isolate gate structure 14 from source and drain regions 18. Since sidewall spacers 17 were doped using trimethylphosphite, they also provide protection to gate structure 14 from mobile ions such as sodium which can degrade the performance of semiconductor device 10. These mobile ions can be introduced into the semiconductor device from poor wafer handling or chemicals such as photoresist.

Figure 3:
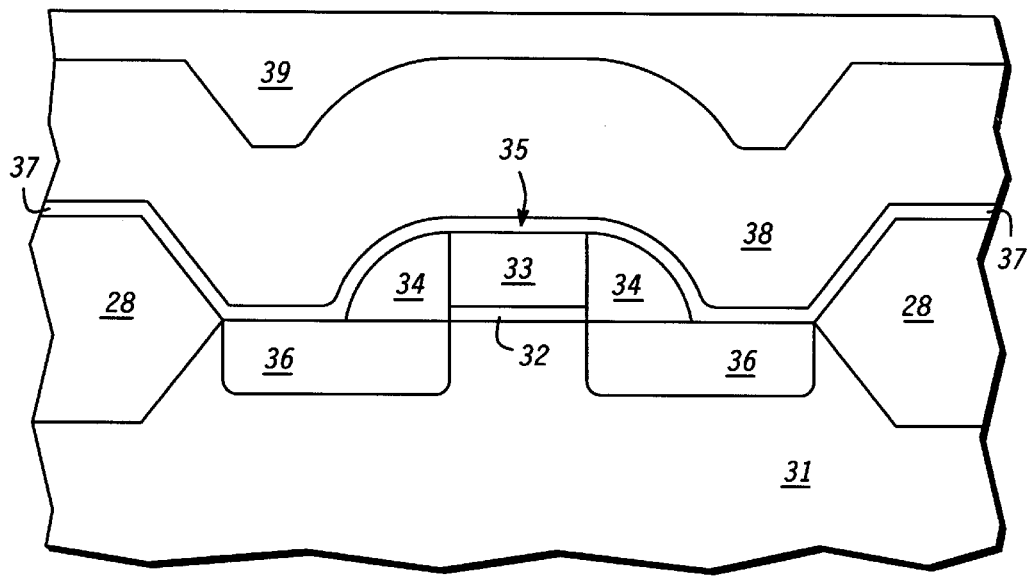
FIGS. 3–5 are enlarged cross-sectional views of a semiconductor device according to a second embodiment at various stages of fabrication.

FIG. 3 is an enlarged cross-sectional view of a semiconductor device 30 according to a second embodiment of the present invention. A phosphorus doped PECVD film that was doped with trimethylphosphite can also be used to form interlevel dielectric layers (ILD). Such a film offers mobile ion gettering properties and improved conformality over previously known films. To form semiconductor device 30 as shown in FIG. 3, portions of a silicon substrate 31 are oxidized to form field oxide regions 28. Using an oxidizing mask such as silicon nitride, portions of substrate 31 are exposed to an oxygen rich ambient at about 800° C. to 1200° C. Field oxide regions 28 are approximately 5,000 angstroms thick and provide electrical isolation for semiconductor device 30.

A gate structure 35, is formed on substrate 31 by a silicon dioxide layer 32 with a thickness in the range from 50 angstroms to 1000 angstroms and a layer of polysilicon 33 is then formed on silicon dioxide layer 32 which is 1,000 angstroms to 4,000 angstroms thick. Sidewall spacers 34 are formed adjacent to the edges of gate structure 35 using either the first embodiment of the present invention, or other techniques known in the art. Source and drain regions 36 are formed in substrate 31 by implanting substrate 31 through a patterned photoresist layer which is aligned to sidewall spacers 34.

An undoped dielectric layer 37 is then deposited over gate structure 35 and the surface of substrate 31. Preferably, undoped dielectric layer is a 100 angstrom to 5,000 angstrom thick layer of silicon dioxide which is deposited with either a CVD or PECVD process. A doped PECVD layer 38 is then deposited on undoped dielectric layer 37 using the method provided in the present invention. Dielectric layer 38 is doped with trimethylphosphite during deposition to have a phosphorus concentration of 1 percent to 12 percent by weight. The thickness of dielectric layer 38 can vary from 1,000 angstroms to 15,000 angstroms with a preferred thickness of 10,000 angstroms.

Figure 4:
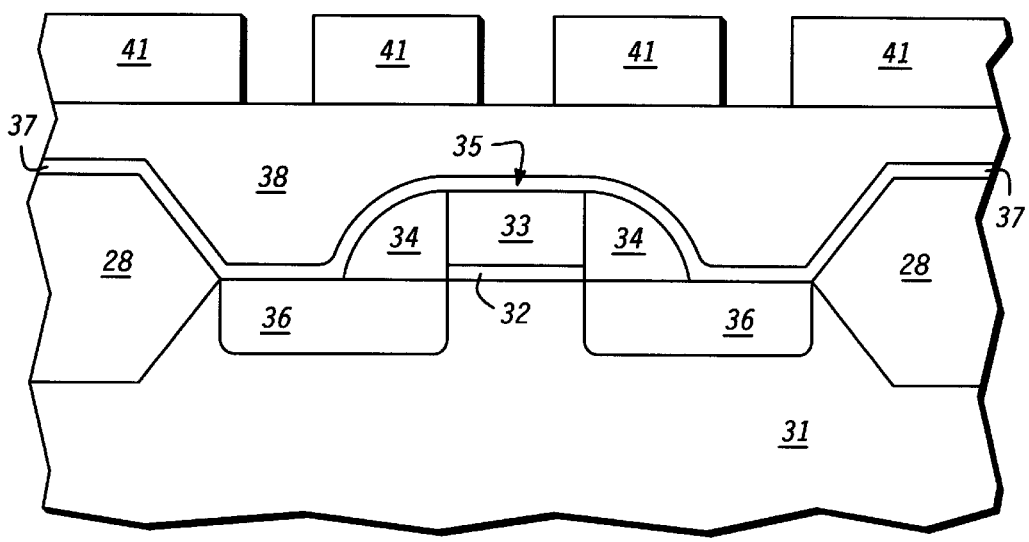

Dielectric layer 38 is then planarized to provide a relatively flat surface for the interconnect layers. One such method first deposits a layer of photoresist 39 on dielectric layer 38. A plasma assisted etch using a fluorine based chemistry is used to etch photoresist layer 39 and portions of dielectric layer 38 at approximately the same rate. An optional oxygen based plasma assisted etch may be used prior to the fluorine based etch to reduce the thickness of photoresist layer 39. This process will form a relatively planar surface as shown in FIG. 4. Any remaining portions of photoresist layer 39 are then stripped and a second photoresist layer 41 is patterned to define contact regions 48 shown in FIG. 5. It is also possible to planarize the surface of dielectric layer 38 with a chemical mechanical polishing process.

Figure 5:
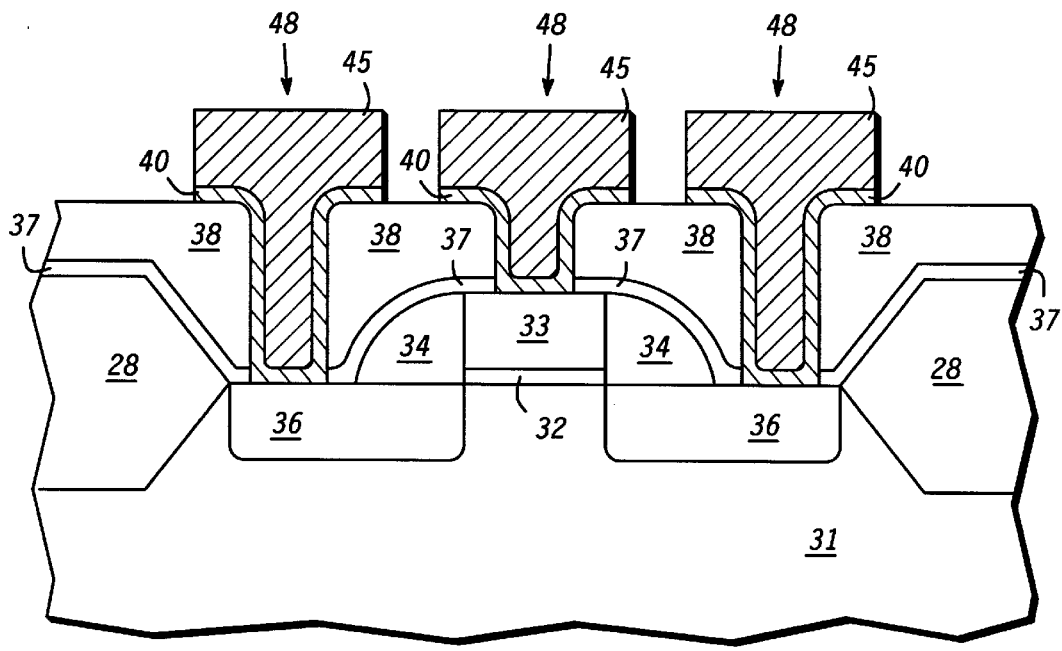

An RIE etch is used to remove the exposed portions of dielectric layer 38 and the underlying undoped dielectric layer 37 to form contact openings. Photoresist layer 41 is then removed and a barrier metal or metal alloy such as titanium tungsten is deposited into the contact openings to form barrier layer 40. Then a metal layer 45, using a material such as aluminum, is either sputtered or evaporated on barrier layer 40. A masking layer in conjunction with an RIE etch is used to form metallized contact regions 48 as shown in FIG. 5. Contacts 48 provide electrical connection to source and drain regions 36 and gate structure 35.

It should be understood that the second embodiment of the present invention can be repeated to form a plurality of interlevel dielectric layers. As mentioned earlier, trimethylphosphite doped films have reduced particulate counts compared to films which are deposited using traditional silane based LPCVD techniques. This is of even greater benefit when the present invention is used to form interlevel dielectric layers. As the thickness of the deposited layer increases, the density of particulates formed will increase, which could exponentially decrease the yield of devices fabricated. The present invention, therefore, can have an exponential improvement in functional yield. Trimethylphosphite doped films also have an improved conformality over silane based films doped with phosphine sources, which reduces the likelihood of forming voids in the interlevel dielectric layers due to poor step coverage over high aspect ratio device topographies.

Undoped dielectric layer 37 of semiconductor device 30 is formed to prevent the diffusion of phosphorus from dielectric layer 38 into either gate structure 35 or substrate 31. In some applications, however, it may be either desirous or insignificant if dopant should diffuse out of dielectric layer 38 such as if dielectric layer 38 is used to form a second or third inter-level dielectric layer or if only n-channel devices are formed. In such an application, the present invention can be used to dope gate structure 35 and source and drain regions 36 with phosphorus from dielectric layer 38. The out diffusion of the phosphorus will reduce the resistivity of gate structure 35 and improve the conduction of source and drain regions 36.

Figure 6:
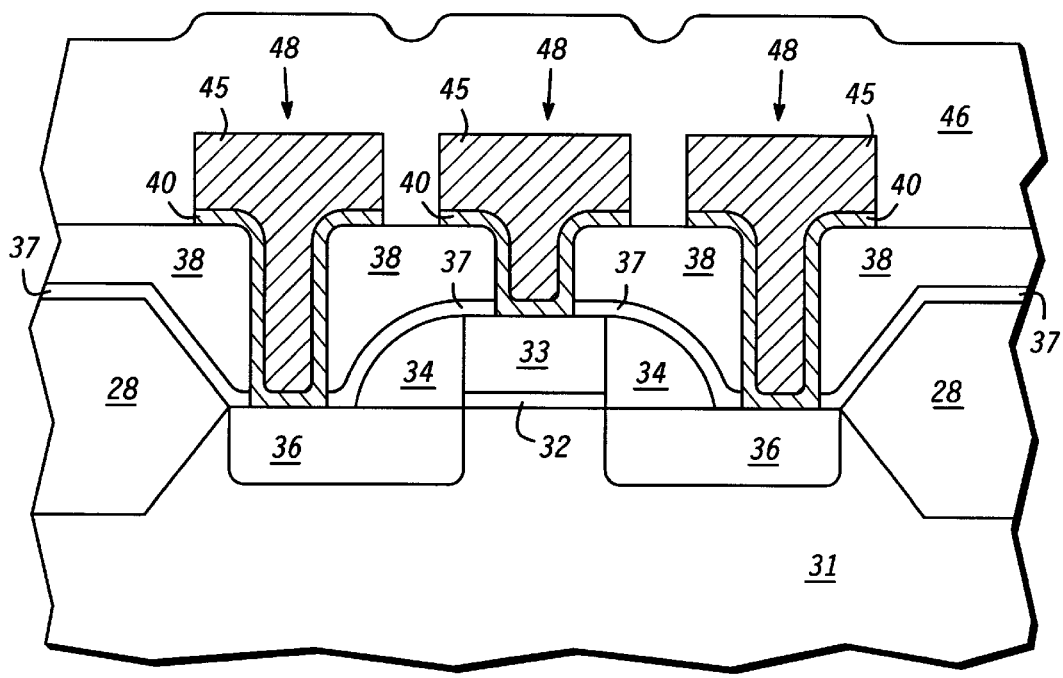
FIG. 6 is an enlarged cross-sectional view of a semiconductor device according to a third embodiment.

FIG. 6 is an enlarged cross-sectional view of semiconductor device 30 according to a third embodiment of the present invention. Since the trimethylphosphite doped layer has a phosphorus concentration which will getter mobile ions, it can also be used as a passivation layer 46 over semiconductor device 30. A 1,000 angstrom to 10,000 angstrom thick PECVD film doped with trimethylphosphite is used to form passivation layer 46. As mentioned earlier, the trimethylphosphite doped film is deposited below the melting point of most metal films used in semiconductor applications. This property, coupled with the fact that a passivation layer can be formed with a single deposition step, make the present invention an efficient and cost effective solution for forming passivation layer 46.

By now it should be appreciated that the present invention provides a method for forming a phosphorus doped dielectric layer using trimethylphosphite that has several applications in semiconductor device structures. The trimethylphosphite is used while in a liquid phase and is not as toxic or environmentally hazardous has phosphine. By using trimethylphosphite instead of phosphine, the present invention provides the unexpected result of improved film conformality, improved control of phosphorus concentration from run to run, and reduced particulate counts over previously known methods for forming dielectric layers. The trimethylphosphite doped dielectric layer is formed in a single step deposition process at temperatures that are below that of most metallic films used in the semiconductor industry. Therefore, the present invention offers a lost cost, high throughput process that can be used in a variety of device structures such as sidewall spacers 17, interlevel dielectric layer 38, or a passivation layer 46.

We claim:

1. A method for manufacturing a semiconductor device comprising the steps of:
   providing a semiconductor substrate of a first conductivity and having a surface;
   growing a layer of silicon dioxide on the semiconductor substrate;
   depositing a layer of polysilicon on the semiconductor substrate;
   patterning the layer of silicon dioxide and the layer of polysilicon to form a gate structure that extends above the surface of the semiconductor substrate;
   depositing a dielectric layer overlying the gate structure and the semiconductor substrate, wherein the dielectric layer is formed by a plasma enhanced chemical vapor deposition process and the dielectric layer is doped with trimethylphosphite as the dielectric layer is deposited;
   etching the dielectric layer with a reactive ion etch process thereby forming sidewall spacers adjacent to the gate structure;
   annealing the semiconductor substrate thereby driving phosphorus from the dielectric layer and forming doped regions under the sidewall spacers; and
   forming a source region and a drain region in the semiconductor substrate.

2. The method for manufacturing a semiconductor device of claim 1 further comprising the steps of:
   depositing a layer of refractory material on the semiconductor substrate and the gate structure;
   annealing the layer of refractory material to form silicide regions contacting the source region, the drain region, and the gate structure; and
   removing any remaining portions of the layer of refractory material from the semiconductor substrate.

3. The method for manufacturing a semiconductor device of claim 1, wherein the step of depositing a dielectric layer comprises doping the dielectric layer with trimethylphosphite to provide a phosphorus concentration of 1 percent to 12 percent by weight.

4. The method for manufacturing a semiconductor device of claim 1, wherein the step of depositing a dielectric layer overlying the gate structure and the semiconductor substrate comprises forming a layer of silicon dioxide.

5. A method for manufacturing a semiconductor device comprising the steps of:
   providing a semiconductor substrate having a surface;
   forming a gate structure having sides on the surface of the semiconductor device;
   forming a dielectric layer overlying the gate structure and the surface of the semiconductor substrate by using plasma enhanced chemical vapor deposition that is doped with trimethylphosphite as the dielectric layer is deposited;
   removing a portion of the dielectric layer to form sidewall spacers on the sides of the gate structure;
   heating the semiconductor substrate thereby driving phosphorus from the dielectric layer and forming doped regions under the sidewall spacers;
   depositing a layer of refractory material on the semiconductor substrate and the gate structure; and
   annealing the layer of refractory material to form a silicide region on the gate structure.

6. The method for manufacturing a semiconductor device of claim 5, wherein the step of forming a dielectric layer comprises doping the dielectric layer with trimethylphosphite to a phosphorus concentration of 1 percent to 12 percent by weight.

7. The method for manufacturing a semiconductor device of claim 5, wherein the step of forming a dielectric layer comprises forming a layer of silicon dioxide.

8. A method of forming a semiconductor device comprising the steps of:
   providing a semiconductor substrate having a surface;
   forming a gate structure on the semiconductor substrate that extends above the surface of the semiconductor substrate;
   depositing a dielectric layer overlying the gate structure, wherein the dielectric layer is formed by a plasma enhanced chemical vapor deposition process that dopes the dielectric layer with trimethylphosphite as the dielectric layer is deposited;
   forming sidewall spacers adjacent to the gate structure by removing portions of the dielectric layer;
   heating the semiconductor substrate thereby driving phosphorus from the sidewall spacers into the semiconductor substrate to form doped regions underlying the sidewall spacers; and
   forming a source and drain region in the semiconductor substrate after the step of heating the semiconductor substrate.

9. The method of claim 8 wherein the gate structure has a height in the range of 1,000 to 4,000 angstroms and the step of forming the sidewall spacers includes the step of removing portions of the dielectric layer with a reactive ion etch.

10. The method of claim 9 wherein the step of forming the sidewall spacers includes forming sidewall spacers that have a width substantially equal to the thickness of the dielectric layer.

* * * * *